(12) United States Patent
Hosseini et al.

(10) Patent No.: US 7,745,913 B2
(45) Date of Patent: Jun. 29, 2010

(54) POWER SEMICONDUCTOR COMPONENT WITH A POWER SEMICONDUCTOR CHIP AND METHOD FOR PRODUCING THE SAME

(75) Inventors: Khalil Hosseini, Weihmichl (DE); Alexander Koenigsberger, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 580 days.

(21) Appl. No.: 11/694,516

(22) Filed: Mar. 30, 2007

(65) Prior Publication Data

US 2007/0228556 A1   Oct. 4, 2007

(30) Foreign Application Priority Data

Mar. 31, 2006   (DE) ................. 10 2006 015 447

(51) Int. Cl.
  *H01L 23/495*  (2006.01)
(52) U.S. Cl. .................. 257/674; 257/666; 257/669; 257/E23.031
(58) Field of Classification Search ................. 257/666, 257/669, 674, E23.031
  See application file for complete search history.

(56) References Cited

U.S. PATENT DOCUMENTS

| | | | |
|---|---|---|---|
| 6,040,626 A | 3/2000 | Cheah et al. | |
| 6,249,041 B1 | 6/2001 | Kasem et al. | |
| 6,319,755 B1 | 11/2001 | Mauri | |
| 6,762,067 B1 | 7/2004 | Quinones et al. | |
| 6,774,466 B1 | 8/2004 | Kajiwara et al. | |
| 6,841,421 B2 | 1/2005 | Aono et al. | |
| 6,943,434 B2 * | 9/2005 | Tangpuz et al. | 257/666 |
| 7,371,616 B2 * | 5/2008 | Jereza | 438/123 |
| 2005/0212101 A1 * | 9/2005 | Funato et al. | 257/666 |
| 2005/0269694 A1 | 12/2005 | Luechinger | |
| 2006/0017141 A1 * | 1/2006 | Luo et al. | 257/666 |
| 2006/0055011 A1 | 3/2006 | Carney et al. | |
| 2007/0040252 A1 | 2/2007 | Hosseini | |
| 2007/0045785 A1 * | 3/2007 | Noquil | 257/666 |
| 2007/0176267 A1 * | 8/2007 | Abbott | 257/666 |

FOREIGN PATENT DOCUMENTS

| | | |
|---|---|---|
| DE | 102004036905 A1 | 3/2003 |
| JP | 2002208673 | 7/2002 |
| JP | 2003229527 | 8/2003 |
| WO | 2006021191 A1 | 3/2006 |

* cited by examiner

*Primary Examiner*—Nitin Parekh
(74) *Attorney, Agent, or Firm*—Edell, Shapiro & Finnan, LLC (57) ABSTRACT

A power semiconductor component includes at least one power semiconductor chip and surface-mountable external contacts. The power semiconductor chip includes large-area contact areas on its top side and its rear side, which cover essentially the entire top side and rear side, respectively. The top side also includes, alongside the large-area contact area, a small-area contact area; the areal extent of the small-area contact is at least ten times smaller than the areal extent of the large-area contact areas. The small-area contact area is connected to an individual external contact of the power semiconductor component via a bonding wire connection. The large-area contact area of the top side is connected to external contacts via a bonding tape.

12 Claims, 6 Drawing Sheets

POWER SEMICONDUCTOR COMPONENT WITH A POWER SEMICONDUCTOR CHIP AND METHOD FOR PRODUCING THE SAME

CROSS REFERENCE TO RELATED APPLICATIONS

This application claims priority under 35 U.S.C. §119 to Application No. DE 102006015447.9 filed on Mar. 31, 2006, entitled "Power Semiconductor Component Comprising a Power Semiconductor Chip and Method for Producing the Same," the entire contents of which are hereby incorporated by reference.

BACKGROUND

A known power semiconductor component includes a power semiconductor chip and surface-mountable external contacts, wherein the power semiconductor chip includes a large-area contact area on its top side, which is connected to a lead clip that merges into external contacts. A small-area contact area on the top side of the power semiconductor chip is also connected to a correspondingly smaller adapted lead clip. The disadvantage of this solution is that mechanical loadings of the external contacts via the lead clips act on the brittle crystal body of the power semiconductor chip, and thus jeopardize the reliability and functionality of the power semiconductor chip. Moreover, the fabrication and shaping of three-dimensional lead clips for the contact areas of the top side of the power semiconductor chip are cost-intensive.

Another known semiconductor component replaces the rigid lead clip with a plurality of flexible bonding wires, thereby overcoming the rigid coupling between external contacts and power semiconductor chips. However, in this case, one costly solution is replaced by another cost-intensive and time-consuming solution, especially as the required plurality of bonding wire connections has to be applied serially.

SUMMARY

A power semiconductor component and a method for producing the same are described herein. The power semiconductor component includes at least one power semiconductor chip and surface-mountable external contacts. The power semiconductor chip includes large-area contact areas on its top side and its rear side, which cover essentially the entire top side and rear side, respectively. The top side also includes, alongside the large-area contact area, a small-area contact area; the areal extent of the small-area contact is at least ten times smaller than the areal extent of the large-area contact areas. The small-area contact area is connected to an individual external contact of the power semiconductor component via a bonding wire connection. The large-area contact area of the top side is connected to external contacts via a bonding tape.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The invention will now be explained in more detail with reference to the accompanying figures, where.

DETAILED DESCRIPTION

A power semiconductor component comprises at least one power semiconductor chip including large-area contact areas on its top side and its rear side, which cover essentially the entire top side and rear side, respectively. In this case, the large-area contact area of the rear side is electrically conductively fixed on an external contact of the power semiconductor component. The top side further comprises, alongside the large-area contact area, a small-area contact area, the areal extent of which is at least ten times smaller than the areal extent of the large-area contact areas. The small-area contact area is connected to an individual external contact of the power semiconductor component via a bonding wire connection, while the large-area contact area of the top side is connected to external contacts of the power semiconductor component via a bonding tape.

A power semiconductor component of this type has the advantage that the external contacts on the underside of the power semiconductor component which are to be connected to the contact areas on the top side of the power semiconductor chip are not connected by a rigid lead clip, but rather by flexible bonding connections. In particular the bonding tape that connects the large-area contact area on the top side of the semiconductor chip to contact pads on the external contacts has the advantage that only one bonding operation is necessary in order to realize an electrical connection for a high current density between the large-area contact area of the top side of the power semiconductor chip and corresponding external contacts which can be contact-connected from the underside of the power semiconductor component, thereby obviating the need for a plurality of individual bonding wire connections.

A further advantage of this power semiconductor component is that it can be produced at lower costs than the solutions provided by the known semiconductor components. Moreover, it is not necessary to keep three-dimensional lead structures. The interspace between the semiconductor chip, which is arranged by its rear side on a central contact pad of a central external contact of the power semiconductor component, and the rest of the external contacts that are electrically connected to the contact areas on the top side of the semiconductor chip is advantageously realized solely by the bonding operation of the bonding tape or the bonding wire. A height difference is simultaneously overcome in this case. The external contacts can consequently be arranged in one plane and therefore be fabricated from a lead plate, which likewise reduces the costs compared with conventional solutions.

In one exemplary embodiment, the bonding tape has a width that is less than the width of the large-area contact area of the top side of the power semiconductor chip. The smaller width of the bonding tape compared with the width of the large-area contact area of the top side of the power semiconductor chip advantageously has the effect that there is enough space to be able to mount without any difficulties the bonding wire that connects the small-area contact area of the top side of the power semiconductor chip to a corresponding external contact.

In a further embodiment, the bonding tape comprises a cutout for accommodating the region of the small-area contact area. In this embodiment, a bonding tape with a variable width is used in order to utilize the largest possible part of the large-area contact area for the fitting of the bonding tape. Nevertheless, on account of the cutout provided in the width of the bonding tape, a bonding wire connection between the small-area contact area on the top side of the power semiconductor chip and a corresponding external contact can be produced without any problems.

In a further embodiment the bonding tape comprises on the large-area contact area at least one strip-type joining region, in which the bonding tape is cohesively connected to the large-area contact area. A joining strip of this type arises as a result of a correspondingly shaped bonding stylus that is large enough to cohesively connect a strip of this type to the large-area contact area by thermocompression bonding. A joining strip of this type and hence also a bonding stylus of this type have a width at least as wide as the width of the bonding tape.

In a further embodiment, the bonding tape comprises a bonding arc that bridges the distance between the power semiconductor chip and an external contact, and therefore electrically connects the top side of the semiconductor chip in a contact pad on an external contact of the power semiconductor component in a relatively flexible manner. At the same time, bonding arcs of this type serve for better heat dissipation of the power loss of a power semiconductor, component, especially as in total a larger amount of heat can be dissipated via a bonding tape arc of this type than via a plurality of bonding wires.

In a further embodiment, the bonding tape comprises on the large-area contact area of the top side of the power semiconductor chip a plurality of joining strips connected via at least one bonding arc. In this embodiment of the invention, the bonding stylus is used to produce a plurality of strip regions of the bonding tape on the contact pad alongside one another. These are electrically and thermally connected to one another in each case via corresponding bonding tape arcs. This has the advantage that in the case of the large-area contact area on the top side of the power semiconductor chip, it is possible to reduce the bonding forces when fitting the bonding tape since the bearing area per joining strip and hence the press-on force of the bonding stylus can be reduced.

Moreover, joining strips are provided on corresponding contact pads of the external contacts in order to fix the bonding tape on the external contacts and to provide a low-resistance connection between the large-area contact area of the top side of the power semiconductor chip and the external contacts.

Optionally, the bonding tape comprises a strip-type metal film, in particular composed of aluminum or an aluminum alloy. In this case, alloying elements such as silicon or copper are optionally provided for the aluminum film, which reduces the electromigration of the bonding tape material during the operation of the power semiconductor component.

In order to provide an intensive and reliable bonding connection between the bonding tape and the large-area contact pad on the top side of the power semiconductor chip, optionally a noble metal layer of gold is deposited on the large-area contact area if the bonding tape comprises an aluminum alloy, since these two metals form a eutectic alloy having a low melting point.

A method for producing a plurality of power semiconductor components comprises the following method steps. The first step involves producing power semiconductor chips with large-area contact areas on at least one top side to a source electrode and on a rear side to a drain electrode and also with a small-area contact area on the top side to a gate electrode. In this case, the small-area contact area has an areal extent which is at least ten times smaller than the areal extent of the large-area contact areas. Moreover, a leadframe composed of lead material with power semiconductor device positions is produced, wherein the leadframe can be produced by structuring a planar electrically conductive metal plate.

If the leadframe is present for a plurality of power semiconductor components and the power semiconductor chips have been produced, the power semiconductor chips are applied in the power semiconductor device positions with cohesive connection of the large-area contact area of the rear side of the power semiconductor chips on a central contact pad of a central surface-mountable external contact in the power semiconductor device positions of the leadframe. It is then possible to produce the connections between the top side of the power semiconductor chip and further contact pads on corresponding external contacts. For this purpose, the bonding wire connection is produced between the small-area contact area and a surface-mountable external contact of the power semiconductor component.

Subsequently, a bonding tape is applied to the large-area contact of the top side of the power semiconductor chip with cohesive connection of at least one strip-type joining region of the bonding tape to the large-area contact area and with formation of at least one bonding tape arc to a surface-mountable external contact on the underside of the power semiconductor component. Once the bonding connections have been completed, the power semiconductor chip, the bonding wire and the bonding tape and also the external contacts in the power semiconductor device positions of the leadframe are embedded into a plastic housing composition. In this case, at least external contact areas of the surface-mountable external contacts on the underside of the power semiconductor component are kept free of plastic housing composition. The leadframe is then separated into individual power semiconductor components.

This method has the advantage that special connecting elements such as three-dimensional lead clips are not required; rather the connection of the large-area contact areas on the top side of the power semiconductor chips in the power semiconductor devices to a continuously bondable bonding tape can be produced via a correspondingly shaped bonding tool. This reduces the fabrication costs and at the same time increases the reliability of the power semiconductor components. In particular, compared with a plurality of bonding wire connections, it improves the dissipation of the heat loss of the power semiconductor chip via the bonding tape.

For the production of power semiconductor chips with large-area contact areas on at least one top side to a source electrode and on a rear side to a drain electrode and also with a small-area contact area to a gate electrode, a semiconductor wafer is used which includes a plurality of semiconductor chip positions, and which subsequently, in order to produce the individual power semiconductor chips, can be correspondingly separated to form individual power semiconductor chips from the semiconductor chip positions.

For the production of a leadframe composed of lead material with power semiconductor device positions, a planar plate comprising copper or copper alloy may be structured, etching and/or stamping techniques optionally being used for the structuring.

For the cohesive connection of the large-area contact area of the rear side of the power semiconductor chip on a central contact pad of a surface-mountable central external contact in the power semiconductor device positions of a leadframe, it is possible to use a soldering method, optionally a diffusion soldering method or a soft solder method or else a method using a conductive adhesive.

The application of a bonding tape to the large-area contact area of the top side of the power semiconductor chip with cohesive connection of at least one strip-type joining region of the bonding tape to the large-area contact area and with formation of at least one bonding tape arc to a surface-mountable external contact of the underside of the power semiconductor component may be effected via thermocompression bonding with the use of a wide bonding stylus, the bearing area of which on the bonding tape corresponds to the width of the bonding tape.

The embedding of the power semiconductor chip, the bonding wire, the bonding tape and partly the external contacts in the power semiconductor device positions of the leadframe into a plastic housing composition may be realized via an injection-molding method or a dispensing method.

In a further variant of the method, the bonding tape is multiply bonded on the large-area contact area of the top side of the power semiconductor chip with formation of bonding tape arcs. For this purpose, a tape-type aluminum film or an aluminum alloy film may be used as the bonding tape, and in addition, in order to improve the bondability of a large-area contact area, the latter may be coated with a noble metal, preferably with gold.

In the following paragraphs, exemplary embodiments of the power semiconductor component and method are described in connection with the figures.

Figure 1:
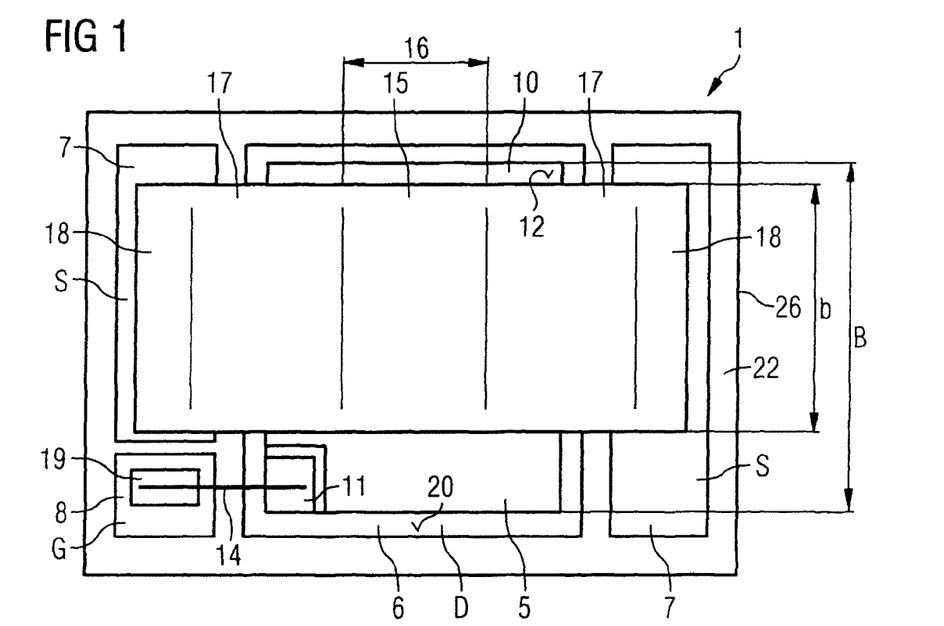
FIG. 1 shows a schematic plan view of a power semiconductor device in accordance with a first embodiment.

FIG. 1 shows a schematic plan view of a power semiconductor component 1 in accordance with a first embodiment. In order to illustrate the construction of the power semiconductor component 1, the plastic housing composition has been omitted, and only the contour 26 of the plastic housing composition 22 is shown in this plan view of the power semiconductor component 1. The power semiconductor component 1 comprises three levels arranged one above another. A lower level is formed by an external contact 6 for a drain terminal D and two further external terminals 7 for a source terminal S and an external contact 8 for a gate terminal G.

A second level is formed by a power semiconductor chip 5 comprising a large-area contact area on its rear side 13, the contact area covering virtually the entire rear side 13. The power semiconductor chip 5 is cohesively and electrically conductively fixed by its rear-side contact area on a central contact pad 20 of a central external contact 6. On its top side 12, the power semiconductor chip 5 comprises a large-area contact area 10, which connects a plurality of source electrodes of the field effect power semiconductor component to one another, and a small-area contact area 11, via which all the gate electrodes of the field effect power semiconductor component or the power semiconductor chip 5 are driven.

The third and topmost level is formed by a bonding tape 15, which is cohesively connected in a strip-type joining region 16 to the large-area contact area 10 of the source electrodes and is electrically conductively contact-connected to contact pads 18 of the external contacts 7 via bonding tape arcs 17. This connection level, in which the bonding tape 15 is situated, also includes a bonding wire connection 14, which electrically connects the small-area contact area 11 of the gate electrodes to a contact pad 19 on the external contact 8.

Via the bonding tape 15 having the width b, which approximately reaches the width B of the large-area contact area 10 on the top side 12 of the power semiconductor chip 5, more area is made available for heat dissipation via the external contacts 7, with the result that rapid dissipation of heat via the bonding tape 15 becomes possible in the event of short-time loadings. A homogenous heat distribution, which is not ensured in the case of a multiplicity of bonding wire connections, is furthermore achieved via the bonding tape 15. Moreover, the bonding tape 15 can be expected to enable a higher current loading compared with conventional power semiconductor components that operate with bonding wire connections for the source electrodes, with the result that overall this power semiconductor component 1 has a higher thermal reliability and, on account of the large-area bonding tape connection, lower fabrication costs than conventional multiple bonding wire connections and/or than conventional three-dimensional lead clips that extend from the lower level as far as the upper level in conventional components are possible.

Figure 2:
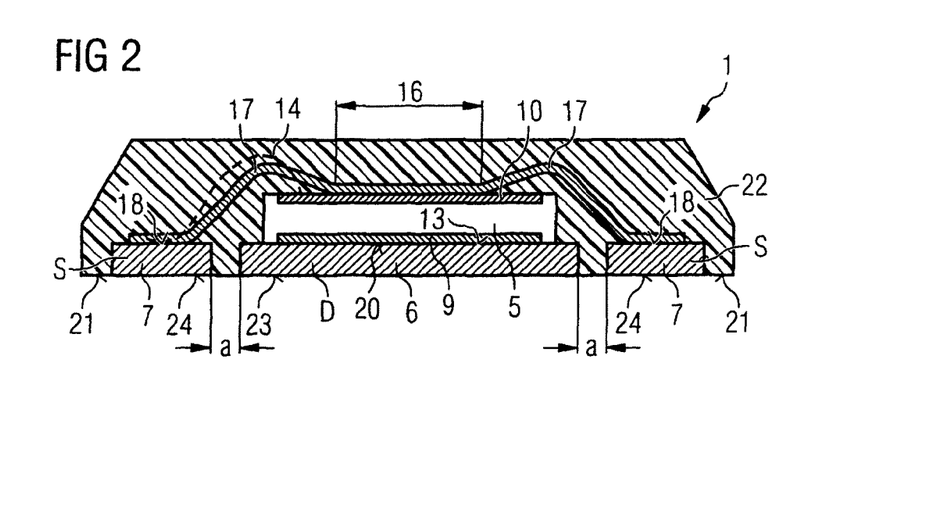
FIG. 2 shows a schematic cross section through the power semiconductor device in accordance with FIG. 1.

FIG. 2 shows a schematic cross section through the power semiconductor component 1 in accordance with FIG. 1. In this first embodiment, the power semiconductor component 1 comprises on its underside 21 external contact areas 23 for a drain terminal D and external contact areas 24 for source terminals S and an external contact area 25—which cannot be seen in this sectional view but is then shown in FIG. 3—for a gate terminal G. Consequently, this first embodiment of the power semiconductor component 1 is exclusively surface-mountable since it does not have any external contact areas at the edge sides.

In the second level, in which the power semiconductor chip 5 is arranged, it becomes clear from this cross-sectional drawing, then, that the large-area contact area 9 on the rear side 13 of the power semiconductor chip 5 is cohesively connected to the central contact pad 20 of the external contact 6 for the drain terminal D. The large-area contact area 10 on the top side 12 of the semiconductor chip 5, which is connected to a plurality of source electrodes, is areally contact-connected by a joining strip 16 of the bonding tape 15. Furthermore, the bonding tape 15 with the bonding tape arcs 17 bridges the distance a to the external contacts 7. A dashed line shows the course of the bonding wire connection 14—not visible in this plane—for the gate terminal.

Figure 3:
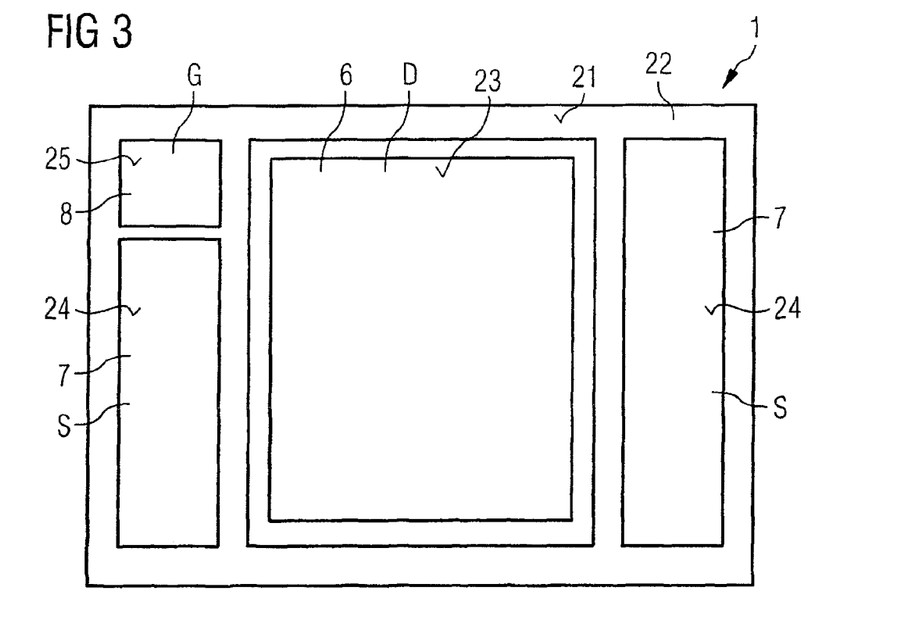
FIG. 3 shows a schematic bottom view of the power semiconductor device in accordance with FIG. 1.

FIG. 3 shows a schematic bottom view of the power semiconductor component 1 in accordance with the embodiment of FIG. 1. External contacts 6, 7 and 8 completely embedded into a plastic housing composition 22 by their edge sides can be seen, then, on the underside 21 of the power semiconductor component 1, a central contact 6 for the drain terminal D being provided and two external contacts 7 arranged at the sides comprising external contact areas 24 which can be used for a source terminal S. Finally, a significantly smaller external contact 8 is provided with its external contact area 25 for a gate terminal G.

Figure 4:
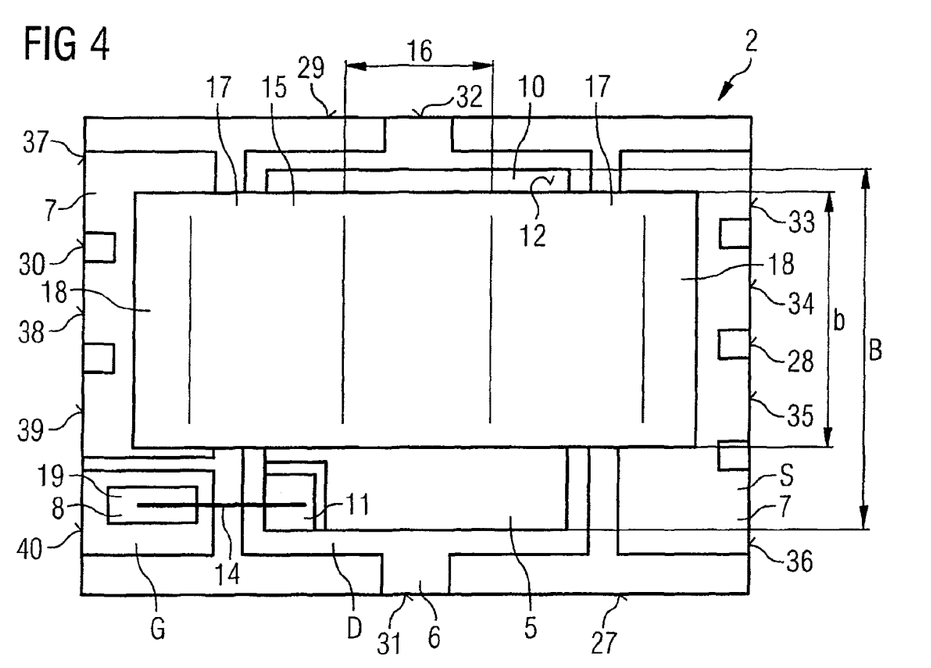
FIG. 4 shows a schematic plan view of a power semiconductor device in accordance with a second embodiment.
Figure 5:
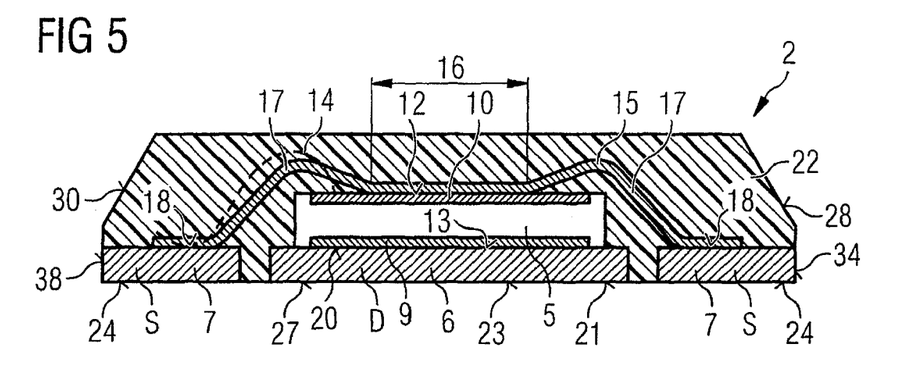
FIG. 5 shows a schematic cross section through the power semiconductor device in accordance with FIG. 4.
Figure 6:
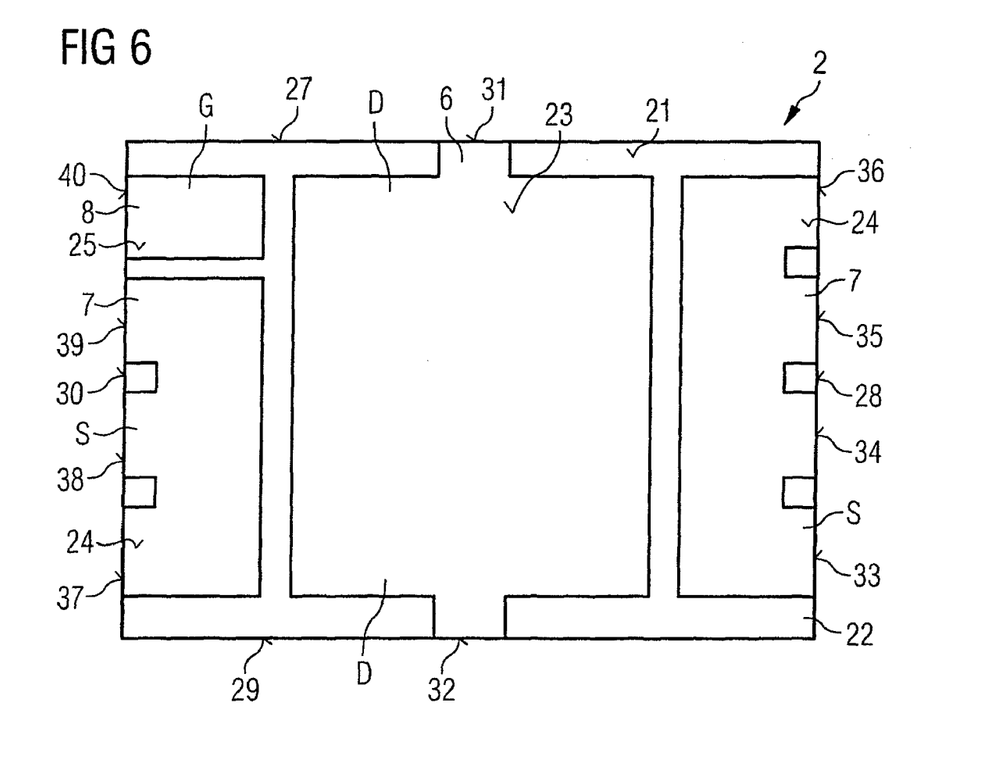
FIG. 6 shows a schematic bottom view of the power semiconductor device in accordance with FIG. 4.

FIGS. 4 to 6 show views of a power semiconductor component 2 in accordance with a second embodiment. Components having the same functions as in the previous figures are identified by the same reference symbols and are not discussed separately.

FIG. 4 shows a schematic plan view of a power semiconductor component 2 in accordance with the second embodiment. The three-level construction is also maintained in the case of the second embodiment, such that external contacts 6, 7 and 8 are again arranged in the lower level, which is associated with the advantage that a planar metal plate can be structured in order to realize the external contacts. The second device level is once again formed by the power semiconductor chip 5, and the third level is formed by the connecting elements, a large-area connecting element being formed by the bonding tape 15 and the connecting elements of the top sides 12 of the power semiconductor chip 2 also including a bonding wire connection 14.

The difference of the second embodiment with respect to the first embodiment consists in the fact that the lower level with external contacts 6, 7 and 8 is stamped out from a leadframe, and, consequently, not only is plastic housing composition 22 arranged on the edges 27, 28, 29 and 30, but also external contact areas 31 to 40 of the individual external contacts 6, 7 and 8 end there. Consequently, external contact areas 31 and 32 of the external contact 6 for a drain terminal D are arranged on the edge sides 27 and 29, respectively, of the power semiconductor component 2. Four contact pads 33 to 36 for a source terminal are arranged on the edge side 28 and three further external contact areas 37, 38 and 39 for the source terminal are additionally provided on the edge side 30. Moreover, an external contact area 40 of the external contact 8 is arranged on the edge side 30. The external contact areas 31 to 40 on the edge sides 27 to 30 enable the power semiconductor component 2 to be plugged into a corresponding plug-in receptacle on a superordinate circuit board.

FIG. 5 shows a schematic cross section through the power semiconductor component 2 in accordance with FIG. 4, this cross section showing external contact areas 34 and 38, which are associated with external contacts 7 of a source terminal, on the edge sides 28 and 30. The wiring of the large-area contact area 10 on the top side 12 of the semiconductor chip 5 is produced in unchanged fashion via an adjoining strip 16, the joining strip 16 being formed by a bonding tape 15 whose bonding arcs 17 produce the contact to the external contacts 7 for the source terminal S.

FIG. 6 shows a schematic bottom view of the power semiconductor component 2 in accordance with FIG. 4. It becomes clear, in this case, that the external contact areas arranged on the underside 21 now also make available external contact areas 31 to 40 on the edge sides 27 to 30.

Figure 7:
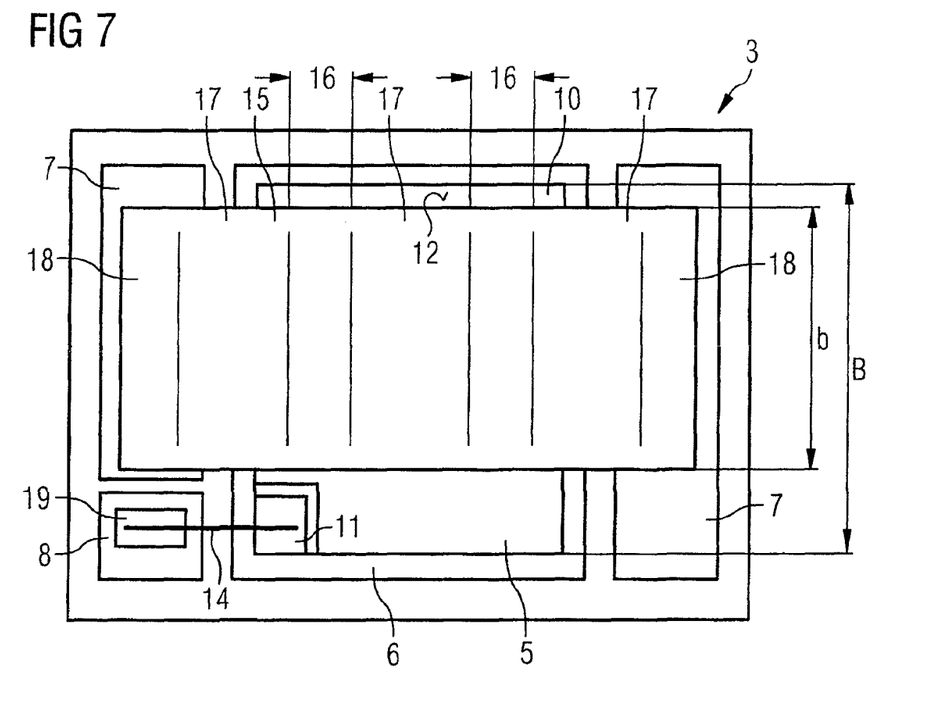
FIG. 7 shows a schematic plan view of a power semiconductor device in accordance with a third embodiment.
Figure 8:
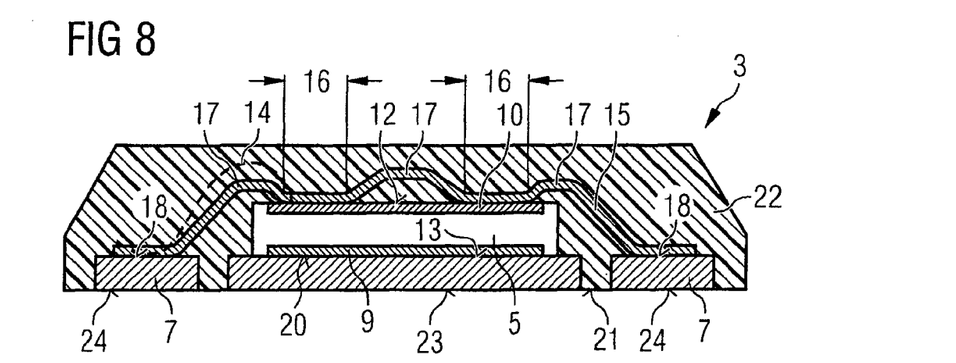
FIG. 8 shows a schematic cross section through the power semiconductor device in accordance with FIG. 7.
Figure 9:
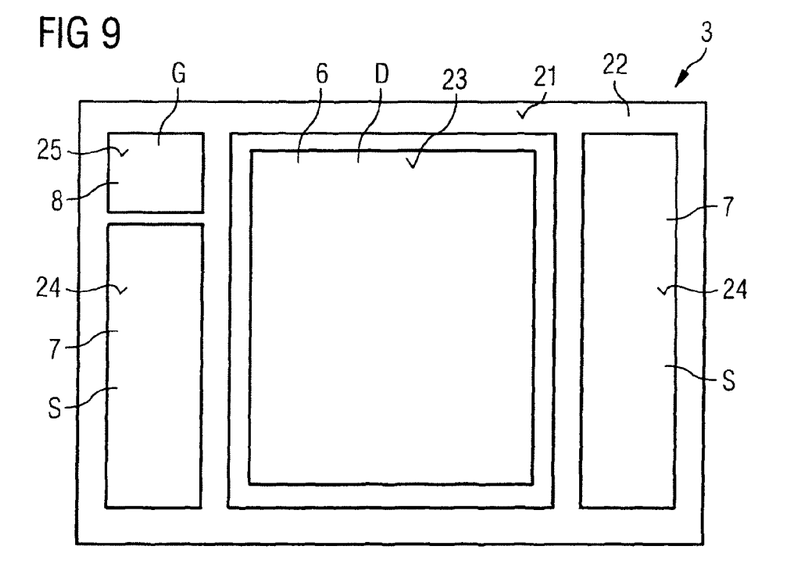
FIG. 9 shows a schematic bottom view of the power semiconductor device in accordance with FIG. 7.

FIGS. 7 to 9 show schematic views of a power semiconductor component 3 of a third embodiment. Components having the same functions as in the previous figures are identified by the same reference symbols and are not discussed separately.

FIG. 7 shows a schematic plan view of a power semiconductor component 3 in accordance with the third embodiment. The difference of the third embodiment with respect to the first embodiment consists in the fact that the bonding tape comprises two joining strips 16 by which it is fixed on the large-area contact area 10 on the top side 12 of the semiconductor chip 5. This third embodiment has the advantage that a smaller bonding stylus can be used, and the compression loading during the thermocompression bonding of the power semiconductor chip is therefore lower.

FIG. 8 shows a schematic cross section through the power semiconductor component 3 in accordance with FIG. 7, wherein the three bonding tape arcs 17 can now clearly be seen, wherein a central bonding tape arc 17 curves between the two joining strips 16 over the large-area contact area 10 of the power semiconductor chip 5 and flexibly connects the two joining strips 16 to one another.

FIG. 9 shows a schematic bottom view of the power semiconductor component 3 in accordance with FIG. 7; this bottom view does not differ from the bottom view of the first embodiment of the invention.

Figure 10:
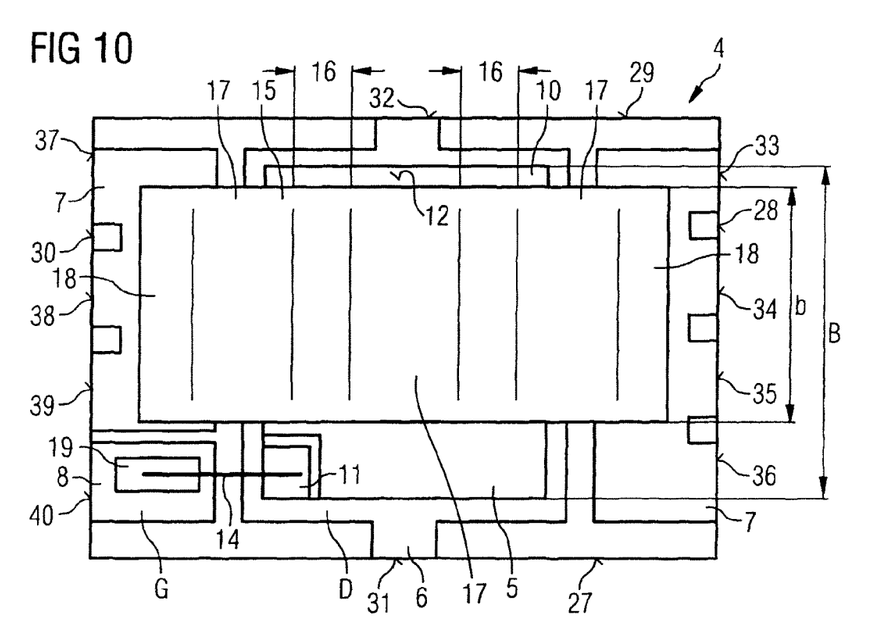
FIG. 10 shows a schematic plan view of a power semiconductor device in accordance with a fourth embodiment.
Figure 11:
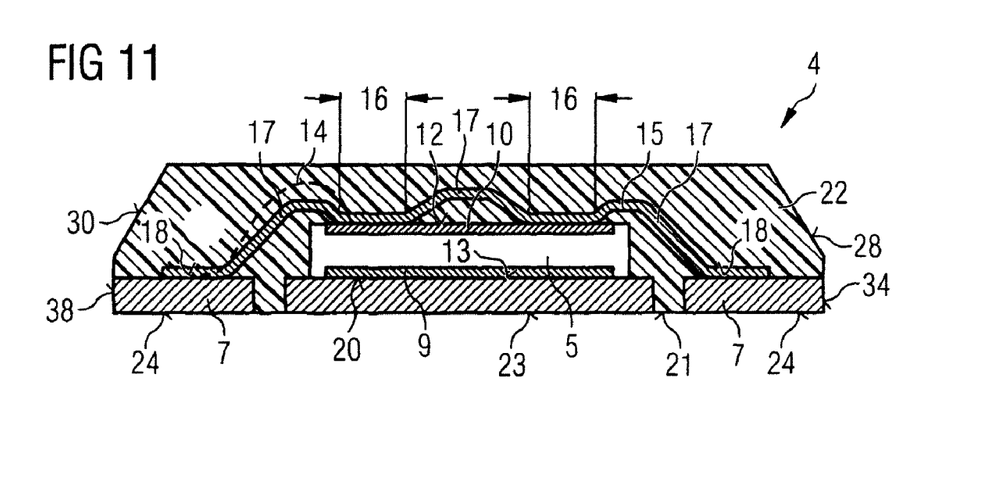
FIG. 11 shows a schematic cross section through the power semiconductor device in accordance with FIG. 10.
Figure 12:
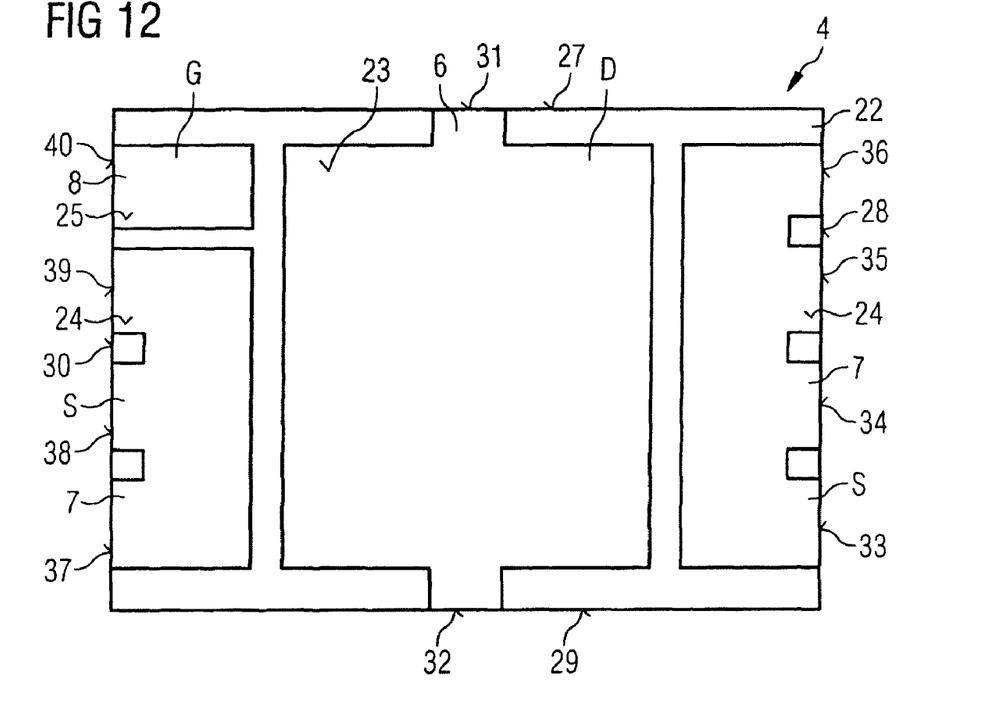
FIG. 12 shows a schematic bottom view of the power semiconductor device in accordance with FIG. 10.

FIGS. 10 to 12 show views of a power semiconductor component 4 in accordance with a fourth embodiment. Components having the same functions as in the previous figures are identified by the same reference symbols and are not discussed separately.

FIG. 10 shows a schematic plan view of the power semiconductor component 4 in accordance with the fourth embodiment. This fourth embodiment essentially corresponds to the second embodiment in accordance with FIGS. 4 to 6. The difference of this fourth embodiment as compared to the second embodiment consists in this case, too, in the fact that the bonding tape is not fixed by one joining strip 16 on the large-area contact area 10 on the top side 12 of the power semiconductor chip 5, but rather by two bonding strips 16 that are electrically connected to one another via a central bonding arc 17. This also becomes clear in the subsequent cross-sectional view.

FIG. 11 shows a schematic cross section through the power semiconductor component 4 in accordance with FIG. 10, in which case, as a difference with respect to the third embodiment, this power semiconductor component now also comprises external contact areas 31 to 40 on the edge sides 27 to 30. Only the external contact areas 34 and 38 thereof can be seen in this cross section on the edge sides 28 and 30. Their arrangement is shown in detail, however, in the subsequent FIG. 12.

FIG. 12 shows a schematic bottom view of the power semiconductor component 4 in accordance with FIG. 10, wherein this bottom view corresponds to the bottom view in FIG. 6 of the second embodiment and shows, on the edge sides 27 to 30, the external contact areas 31 to 40 arranged there and their arrangement.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A power semiconductor component, comprising:
   a plurality of surface-mountable external contacts including a first external contact, second external contacts, and a third external contact;
   a flexible bonding tape;
   a bonding wire connection; and
   at least one power semiconductor chip including:
      first and second large-area contact areas disposed on a rear side and a top side of the semiconductor chip, respectively, wherein the first large-area contact area covers virtually all of the rear side and is electrically conductively fixed on the first external contact and the second large-area contact area of the top side is connected to the second external contacts via the flexible bonding tape, the flexible bonding tape being cohesively connected to and in direct contact with the second large-area contact area and the second external contacts; and a small-area contact area disposed alongside the second large-area contact area on the top side, the small-area contact area having an areal extent being at least ten times smaller than the areal extent of the second large-area contact area, wherein the small-area contact area and the second large-area contact area cover virtually all of the top side, and wherein the small-area contact area is connected to the third external contact via the bonding wire connection.

2. The power semiconductor component of claim 1, wherein the bonding tape has a width that is less than a width of the second large-area contact area.

3. The power semiconductor component of claim 2, wherein the bonding tape comprises a cutout for accommodating the small-area contact area.

4. The power semiconductor component of claim 1, wherein the bonding tape comprises at least one strip-type joining region cohesively connected to the second large-area contact area, the at least one strip-type joining region having a width of the bonding tape.

5. The power semiconductor component of claim 4, wherein the bonding tape further comprises a further joining strip cohesively and electrically connected to a contact pad of a second external contact.

6. The power semiconductor component of claim 1, wherein at least one of the second external contacts has a contact pad, wherein the bonding tape is electrically connected to the contact pad via at least one bonding tape arc bridging the distance between the power semiconductor chip and the external contact.

7. The power semiconductor component of claim 1, wherein the bonding tape comprises a plurality of joining strips disposed on the second large-area contact area and connected via at least one bonding arc.

8. The power semiconductor component of claim 1, wherein the bonding tape comprises a strip-type metal film.

9. The power semiconductor component of claim 1, wherein the bonding tape comprises aluminum or an aluminum alloy.

10. The power semiconductor component of claim 9, wherein the aluminum alloy comprises alloying elements silicon and copper.

11. The power semiconductor component of claim 1, wherein the second large-area contact area further comprises a noble metal coating.

12. The power semiconductor component of claim 11, wherein the noble metal coating comprises gold.

* * * * *